US012727417B2

(12) United States Patent
Kozasa et al.

(10) Patent No.: US 12,727,417 B2
(45) Date of Patent: Sep. 1, 2026

(54) WAFER POLISHING METHOD AND SILICON WAFER

(71) Applicant: SUMCO CORPORATION, Tokyo (JP)

(72) Inventors: Kazuaki Kozasa, Tokyo (JP); Katsuhisa Sugimori, Tokyo (JP); Kazuki Nishioka, Tokyo (JP); Tsuyoshi Morita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 220 days.

(21) Appl. No.: 17/777,395

(22) PCT Filed: Oct. 21, 2020

(86) PCT No.: PCT/JP2020/039527
§ 371 (c)(1),
(2) Date: May 17, 2022

(87) PCT Pub. No.: WO2021/100393
PCT Pub. Date: May 27, 2021

(65) Prior Publication Data

US 2022/0415666 A1 Dec. 29, 2022

(30) Foreign Application Priority Data

Nov. 19, 2019 (JP) ................................ 2019-208657

(51) Int. Cl.
*H10P 52/40* (2026.01)
*B24B 37/04* (2012.01)

(52) U.S. Cl.
CPC .......... *H10P 52/402* (2026.01); *B24B 37/042* (2013.01)

(58) Field of Classification Search
CPC ........... H01L 21/30625; H01L 21/3212; H10P 52/40; H10P 52/402
See application file for complete search history.

(56) References Cited

U.S. PATENT DOCUMENTS 6,027,401 A * 2/2000 Saito .................... B24B 41/042 451/388
2003/0216111 A1* 11/2003 Ohno ...................... B24B 37/24 451/456

(Continued)

FOREIGN PATENT DOCUMENTS

JP 2003-257908 9/2003
JP 2006-142474 6/2006

(Continued)

OTHER PUBLICATIONS

International Search Report, International Patent Application No. PCT/JP2020/039527, issued Jan. 19, 2021, with English translation.

(Continued)

*Primary Examiner* — Thomas T Pham
(74) *Attorney, Agent, or Firm* — GREENBLUM & BERNSTEIN, P.L.C.

(57) ABSTRACT

Provided is a wafer polishing method capable of improving nanotopography characteristics within a site on the surface of a wafer having a 2 mm square area or a small area equivalent thereto and a silicon wafer polished by the wafer polishing method, and further provided is a method of chemical-mechanical polishing the surface of a wafer through a polishing step in two or more polishing steps with different polishing rates, in which the in-plane thickness variation (standard deviation) of a polishing pad 150 used in a polishing step with a machining allowance of 0.3 μm or more is 2.0 μm or less.

5 Claims, 7 Drawing Sheets

(56) References Cited

U.S. PATENT DOCUMENTS

| | | | | |
|---|---|---|---|---|
| 2004/0195657 | A1* | 10/2004 | Miyashita | B24B 37/042 257/618 |
| 2005/0255610 | A1 | 11/2005 | Sato et al. | |
| 2007/0158309 | A1 | 7/2007 | Park | |
| 2011/0183582 | A1* | 7/2011 | Schwandner | H01L 21/02008 451/41 |
| 2011/0256812 | A1* | 10/2011 | Dhandapani | B24B 53/017 451/56 |
| 2016/0059378 | A1* | 3/2016 | Kimura | C08J 9/30 51/296 |
| 2018/0085888 | A1* | 3/2018 | Hendron | B24B 37/205 |
| 2018/0369985 | A1* | 12/2018 | Kawasaki | B24B 37/042 |
| 2019/0061095 | A1* | 2/2019 | Takami | B24B 37/044 |
| 2020/0331115 | A1* | 10/2020 | Tokushige | D06M 23/10 |

FOREIGN PATENT DOCUMENTS

| | | |
|---|---|---|
| JP | 2007-266235 | 10/2007 |
| JP | 2011-155265 | 8/2011 |
| JP | 2017-112302 | 6/2017 |
| WO | 2004/100243 | 11/2004 |
| WO | 2016/076404 | 5/2016 |

OTHER PUBLICATIONS

International Preliminary Report on Patentability, International Patent Application No. PCT/JP2020/039527, issued May 17, 2022, with English translation.

* cited by examiner

WAFER POLISHING METHOD AND SILICON WAFER

TECHNICAL FIELD

The present invention relates to a wafer polishing method and, more particularly, to a wafer polishing method for a silicon wafer having a surface on which nanotopography is formed. The present invention also relates to a silicon wafer polished by such a polishing method.

BACKGROUND ART

Silicon wafers are widely used as a substrate material for semiconductor devices. Silicon wafers are produced by sequentially performing processes including outer periphery grinding, slicing, lapping, etching, double-sided polishing, single-sided polishing, and washing for a silicon single crystal ingot. Of these, the single-sided polishing process is a process required to remove unevenness or waviness on the wafer surface and thus to enhance flatness, in which mirror finishing by CMP (Chemical Mechanical Polishing) is performed.

Usually, in the single-sided polishing process for a silicon wafer, a single-wafer type wafer polishing apparatus (CMP apparatus) is used. The wafer polishing apparatus includes a rotary platen attached with a polishing pad and a polishing head for pressing and holding the wafer on the polishing pad. The apparatus rotates the rotary platen and polishing head while feeding slurry to thereby polish one surface of the wafer.

In recent years, silicon wafers have a problem of a surface minute unevenness called "nanotopography". The nanotopography refers to a periodic waviness component which is present on the wafer surface and has a wavelength shorter than those of "BOW" and "Warp" and longer than that of "surface roughness", the wavelength being 0.2 mm to 20 mm and having an amplitude (Peak-to-Valley value) of several ten nm. When the nanotopography exceeds an appropriate value, yield of STI (Shallow Trench Isolation) in a device process deteriorates, resulting in a large variation in device characteristics such as a threshold voltage $V_T$.

As for the nanotopography, for example, Patent Document 1 describes a slurry composition for chemical-mechanical polishing capable of compensating nanotopography effect, and a method for planarizing the surface of a semiconductor device using the composition.

RELATED ART

Patent Literature

[Patent Literature 1] WO 2004/100243 A1

SUMMARY OF THE INVENTION

Problem to be Solved by the Invention

The recent trend of fine device processing results in a significant reduction in spacing between adjacent elements, so that influence that the nanotopography has on device dimensional accuracy becomes larger and larger. For example, the presence of the nanotopography causes a variation in machining allowance for CMP machining, influencing the height dimension of the elements. Thus, it is necessary to make nanotopography characteristics fall within stricter specifications in the future, and improvement in nanotopography characteristics within a very small area of 2 mm square (2 mm×2 mm) is particularly demanded.

It is therefore an object of the present invention to provide a wafer polishing method capable of improving nanotopography characteristics within a site on the surface of a wafer having a 2 mm square area or a small area equivalent thereto and a silicon wafer polished by the wafer polishing method.

Means for Solving the Problems

As a result of intensive studies about a mechanism to cause nanotopography, the present inventors have made it clear that polishing unevenness occurring in a single-sided polishing process in which a machining allowance is set to about 0.5 μm causes a 2 mm square nanotopography and that the polishing unevenness is caused due to an uneven thickness of a polishing pad. The in-plane thickness variation of the polishing pad has been believed to be required in some extent to retain slurry between the polishing pad and a surface to be machined of a wafer so as to enhance polishing efficiency. However, considering a waviness component in a very small area of 2 mm square, the present inventors have found that it is necessary to sufficiently reduce the in-plane thickness variation of the polishing pad. Further, in evaluation of the nanotopography within a 2 mm square site, use of a 50% threshold value for the nanotopography in place of the 99.95% and 99.5% threshold values has been found to be effective to reduce a variation in device characteristics.

The present invention has been made based on such technical findings, and a wafer polishing method according to the present invention is a method of chemical mechanical polishing on a surface of a wafer through two or more polishing steps with different polishing rates, in which an in-plane thickness variation (standard deviation) of a polishing pad used in a polishing step with a machining allowance of 0.3 μm or more is 2.0 μm or less.

According to the present invention, the 2 mm square nanotopography on the wafer surface caused due to the thickness variation of the polishing pad can be improved. In particular, by reducing the 50% threshold value for the 2 mm square nanotopography to 1.0 nm or less, it is possible to reduce a variation in device characteristics in the wafer plane and thereby to manufacture semiconductor chips having uniform device characteristics.

In the present invention, the two or more polishing steps preferably include a first polishing step of polishing the surface of the wafer by 0.3 μm or more and a second polishing step of polishing the surface of the wafer at a polishing rate lower than that of the first polishing step, and an in-plane thickness variation (standard deviation) of a polishing pad used in the first polishing step is preferably 2.0 μm or less. In this case, a polishing rate of the wafer in the first polishing step is preferably 50 nm/min or more. Polishing unevenness occurring in the first polishing step has influence on the nanotopography on the wafer surface; however, by reducing the thickness variation (standard deviation) of the polishing pad used in the first polishing step to 2.0 μm or less, it is possible to suppress polishing unevenness and thereby to improve the 2 mm square nanotopography.

In the present invention, the 50% threshold value for the nanotopography within a site which is defined on the surface of the wafer that has been polished through the first and second polishing steps and which has a size with a length in at least one direction of 2 mm and an area of 2 $mm^2$ or more and 4 $mm^2$ or less is preferably 1.0 nm or less. The 50% threshold value for the nanotopography refers to a maximum value among 50% of accumulated values of a nanotopography value for each site in the wafer plane which is obtained as a result of excluding top 50% of the accumulated values. The size of the site is more preferably a 2 mm square (2 mm×2 mm). By reducing the 50% threshold value for the nanotopography within a 2 mm square site on the wafer surface to 1.0 nm or less, nanotopography characteristics can further be improved. This makes it possible to reduce a variation in device characteristics in the wafer plane and thereby to manufacture semiconductor chips having uniform device characteristics.

In the present invention, a relative speed of the wafer to the polishing pad in the first polishing step is preferably 0.3 m/s or less, and the in-plane thickness variation (standard deviation) of the polishing pad used in the first polishing step is preferably 1.6 μm or less. Further, a ROA (Roll Off Amount) at a position 1 mm inward from an outermost periphery of the wafer that has been polished through the first and second polishing steps is preferably 20 nm or less. This makes it possible to improve not only the 2 mm square nanotopography on the wafer surface due to a thickness variation of the polishing pad but also the flatness of the wafer outer peripheral portion.

The wafer polishing method according to the present invention preferably further includes a polishing pad thickness evaluation step of measuring an in-plane thickness variation of a polishing pad used in chemical and mechanical polishing of a wafer and checking whether or not the in-plane thickness variation (standard deviation) is 2.0 μm or less and a polishing pad thickness adjustment step of adjusting, when the in-plane thickness variation (standard deviation) of the polishing pad is not 2.0 μm or less, the thickness distribution of the polishing pad so as to reduce the thickness variation (standard deviation) to 2.0 μm or less, and the polishing pad having an in-plane thickness variation (standard deviation) of 2.0 μm or less is preferably used to polish the surface of the wafer by 0.3 μm or more. This allows the thickness variation (standard deviation) of a polishing pad to be used in the polishing step of polishing the wafer surface by 0.3 μm or more to be 2.0 μm or less without fail, thus making it possible to reliably improve nanotopography characteristics within a 2 mm square site on the silicon wafer.

Further, a silicon wafer according to the present invention is a silicon wafer in which the 50% threshold value of nanotopography within a site having a size with a length in at least one direction of 2 mm and an area of 2 $mm^2$ or more and 4 $mm^2$ or less is 1.0 nm or less. In this case, a ROA at a position 1 mm inward from an outermost periphery of the wafer is preferably 20 nm or less. Further, the size of the site is preferably a 2 mm square. According to the present invention, a variation in device characteristics in the wafer plane can be reduced to make it possible to manufacture semiconductor chips having uniform device characteristics.

Advantageous Effects of the Invention

According to the present invention, there can be provided a wafer polishing method capable of improving nanotopography characteristics within a site on the surface of a wafer having a 2 mm square area or a small area equivalent thereto and a silicon wafer polished by the wafer polishing method.

MODE FOR CARRYING OUT THE INVENTION

A preferred embodiment of the present invention will be described in detail below with reference to the accompanying drawings.

Figure 1:
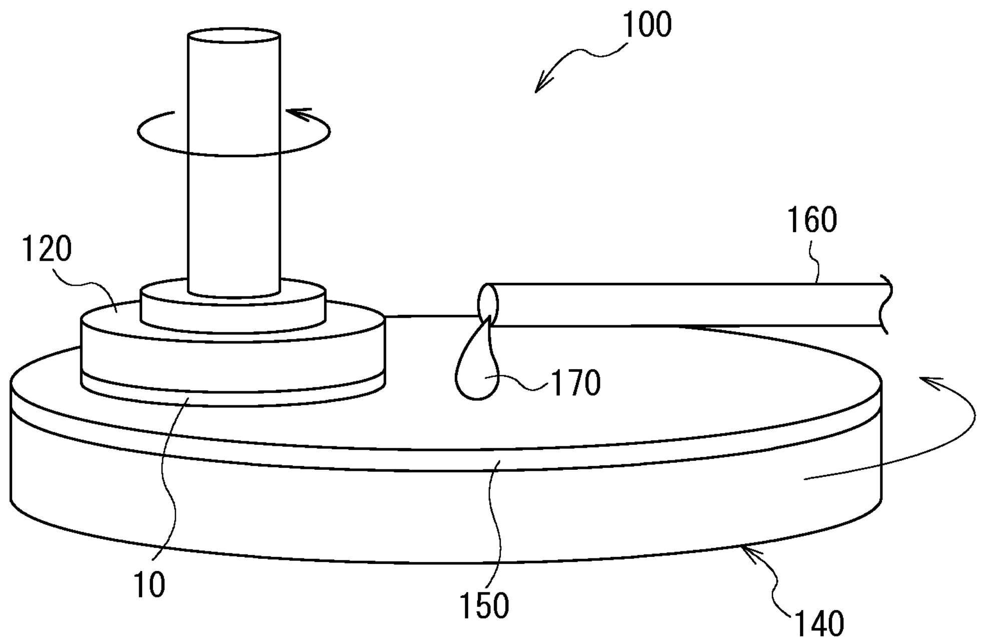
FIG. 1 is a schematic view for explaining a silicon wafer polishing method according to an embodiment of the present invention.

FIG. 1 is a schematic view for explaining a silicon wafer polishing method according to an embodiment of the present invention.

As illustrated in FIG. 1, a silicon wafer polishing method is a method of chemical mechanical polishing one side of a silicon wafer using a single-wafer type single-sided polishing apparatus 100. A silicon wafer 10 to be machined is cut out, using a wire saw, from a silicon single crystal ingot grown by a CZ method and is then subjected to lapping (double-sided grinding) and double-sided polishing.

The single-sided polishing apparatus 100 has a polishing head 120 for chucking the silicon wafer 10 and a rotary platen 140 to which a polishing pad 150 is affixed. The single-sided polishing apparatus 100 is further provided with a rotary mechanism for rotating the polishing head 120 and a moving mechanism for moving the polishing head 120 inside and outside the rotary platen 140.

The polishing pad 150 is not particularly limited in structure and may be a polishing pad having a two-layer structure in which an NAP layer (polyurethane foamed layer) is formed on an underlying layer obtained by impregnating nonwoven fabric with polyurethane or may be a suede type polishing pad having a two-layer structure including a hard NAP layer and a soft NAP layer.

In the single-sided polishing apparatus 100, in a state where the silicon wafer 10 is held by the polishing head 120, a surface to be machined (i.e., surface facing the rotary platen 140) of the silicon wafer 10 is pressed against the polishing pad 150 on the rotary platen 140, and the polishing head 120 and rotary platen 140 are rotated together. Then, slurry 170 is supplied from a slurry supply means 160 while the polishing head 120 and rotary platen 140 are thus relatively moved to thereby chemically and mechanically polish the surface to be polished of the silicon wafer 10.

Figure 2:
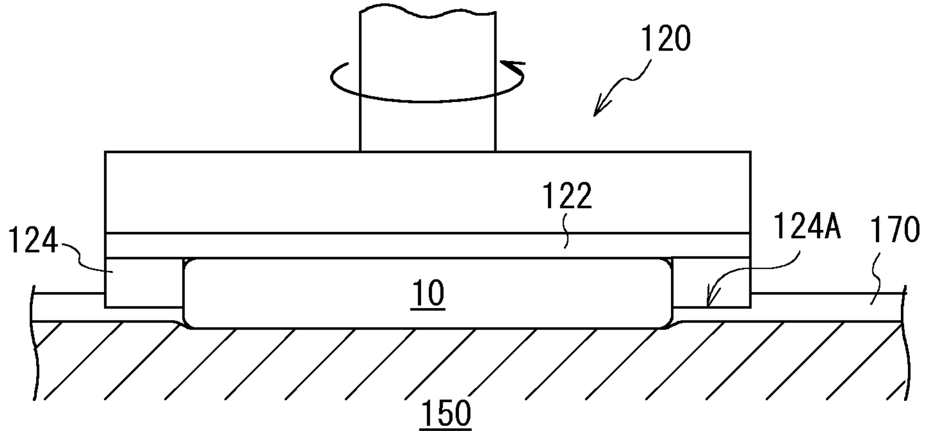
FIG. 2 is a schematic view for explaining the relation between the polishing head and the polishing pad illustrated in FIG. 1.

FIG. 2 is a schematic view for explaining the relation between the polishing head 120 and the polishing pad 150 illustrated in FIG. 1.

As illustrated in FIG. 2, the polishing head 120 has a backing plate 122 for chucking the silicon wafer 10, and a retainer ring 124 for preventing popping-out of the silicon wafer 10 being polished is provided at the peripheral edge of the backing plate 122. The silicon wafer 10 is subjected to single-sided polishing with its one surface (surface to be polished) protruding from a lower end surface 124A of the retainer ring 124, and the polishing pad 150, which is an elastic body, is recessed downward below the silicon wafer 10 due to pressing force from the polishing head 120. The slurry 170 supplied onto the polishing pad 150 flows from the centers of the rotary platen 140 and polishing pad 150 to the peripheral edges thereof by means of centrifugal force caused by the rotation of the rotary platen 140 and enters slight gaps between the silicon wafer 10 and the polishing pad 150 and between the retainer ring 124 and the polishing pad 150.

Figure 3:
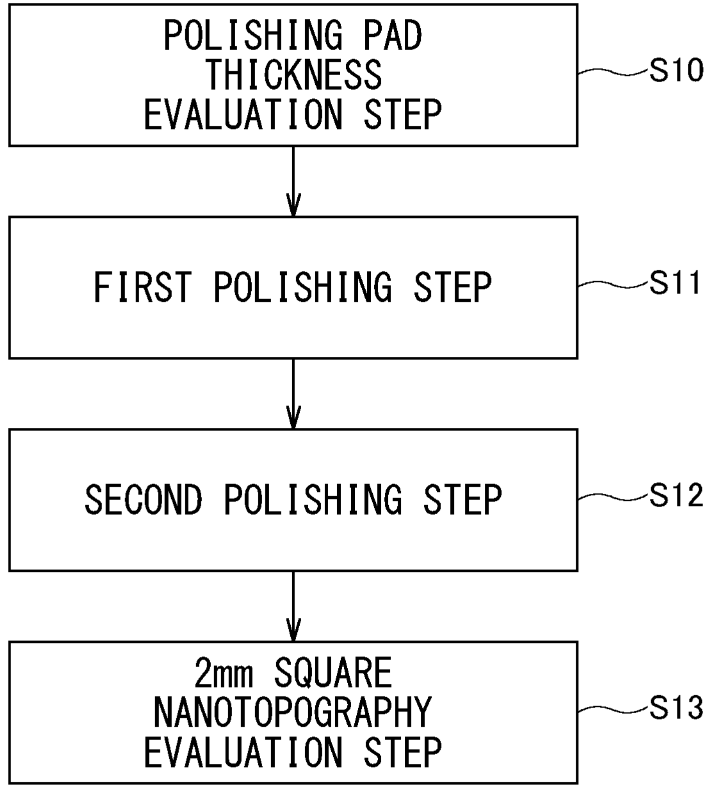
FIG. 3 is a flowchart for explaining the silicon wafer polishing method performed using the single-sided polishing apparatus illustrated in FIG. 1.

FIG. 3 is a flowchart for explaining the silicon wafer polishing method performed using the single-sided polishing apparatus 100 illustrated in FIG. 1.

As illustrated in FIG. 3, the silicon wafer polishing method according to the present embodiment includes a polishing pad thickness evaluation step S10 of measuring in advance a variation in the thickness of the polishing pad, a first polishing step S11 of polishing the surface of the silicon wafer by 0.3 μm or more using the polishing pad after the evaluation, a second polishing step S12 of further polishing the surface of the silicon wafer that has been polished in the first polishing step S11 at a polishing rate lower than that of the first polishing step S11, and a 2 mm square nanotopography evaluation step S13 of measuring the nanotopography within a 2 mm square site on the silicon wafer after the polishing.

The first polishing step S11 is a so-called semi-final polishing step, in which the silicon wafer is polished at a polishing rate higher than that of the second polishing step S12 using slurry having a high etching rate. The polishing rate (first polishing rate) in the first polishing step S11 is 50 nm/min or more and preferably 100 nm/min or more.

The in-plane thickness variation (standard deviation) of a polishing pad used in the first polishing step S11 is set to 2.0 μm or less. Thus, in the first polishing step S11, chemical mechanical polishing is performed with the in-plane thickness variation (standard deviation) of a silicon wafer restricted to 2.0 μm or less, so that it is possible not only to ensure a machining allowance of 0.3 μm or more but also to reduce the nanotopography within a 2 mm square site to 1.0 nm or less.

When the relative speed of the wafer to the polishing pad is set to a low speed of 0.3 m/s or less, the in-plane thickness variation (standard deviation) of the polishing pad used in the first polishing step S11 is preferably set to 1.6 μm or less. When the polishing head and rotary platen are rotated at a low speed to reduce the relative speed of the wafer to the polishing pad, the flatness of the wafer outer peripheral portion can be improved, whereas nanotopography characteristics are likely to deteriorate. However, when the in-plane thickness variation (standard deviation) of the polishing pad is set to 1.6 μm or less, the ROA at a position 1 mm inward from the outermost periphery of the wafer can be reduced to 20 nm or less, and the nanotopography within a 2 mm square site can be reduced to 1.0 nm or less. That is, the flatness of the wafer outer peripheral portion and nanotopography characteristics can be both improved.

The second polishing step S12 is preferably a so-called final polishing step, in which the surface of the silicon wafer is polished at a second polishing rate lower than the first polishing rate using slurry having a low etching rate. The etching rate in the second polishing step S12 is 10 nm/min or less and preferably 5 nm/min or less. In the second polishing step S12, a suede polishing pad constituted of an upper NAP layer and a lower nonwoven fabric layer is used. Further, the low polishing rate allows the use of a polishing pad having a thickness variation (standard deviation) of 20 μm or less.

In the present embodiment, it is preferable to perform, before the first polishing step S11, a polishing pad thickness evaluation step S10 of measuring the in-plane thickness distribution of the polishing pad used in the first polishing step S11 and checking whether or not the in-plane thickness variation (standard deviation) of the polishing pad is 2.0 μm or less. A polishing pad having a thickness variation (standard deviation) of 2.0 μm or less can be used in the first polishing step S11 as an acceptable product. On the other hand, a polishing pad having a thickness variation exceeding 2.0 μm needs to be adjusted in thickness distribution so as to reduce the thickness variation (standard deviation) to 2.0 μm or less. This allows a polishing pad having a thickness variation (standard deviation) of 2.0 μm or less to be used in the first polishing step S11 without fail, thus making it possible to improve nanotopography characteristics within a 2 mm square site on the silicon wafer after polishing.

In the present embodiment, it is preferable to perform, after the first polishing step S11 and second polishing step S12, a 2 mm square nanotopography evaluation step S13 of evaluating the nanotopography within a 2 mm square site on the silicon wafer. When a 50% threshold value of nanotopography within a 2 mm square site on the silicon wafer is 1.0 nm or less, the silicon wafer is determined to be acceptable in terms of nanotopography characteristics; on the other hand, when the 50% threshold value exceeds 1.0 nm, the silicon wafer is determined to be a failure. The 50% threshold value (50% Th) of nanotopography refers to a nanotopography value whose cumulative probability is 50%, which is a maximum value when only relatively small nanotopography is set as an evaluation target with the exclusion of the top 50% nanotopography.

In measuring the nanotopography, a height map indicating the size of the roughness of the wafer surface is created and then flattened by removing micron-order warpage or micron-order waviness therefrom through filtering. Then, the filtered height map of the wafer surface is divided into sites of a desired size (in this example, 2 mm square), and a PV (Peak to Valley) value is calculated for each site. Then, as described above, a PV value whose cumulative probability is 50% is selected from PV values of all sites as a nanotopography value of the wafer surface.

When the silicon wafer after passing through the first polishing step S11 and second polishing step S12 is determined as a failure in terms of nanotopography characteristics, it is preferable to perform a polishing pad thickness adjustment step of adjusting the thickness of the polishing pad that has been used to polish the failed wafer in the first polishing step S11 and then to perform additional polishing of the failed wafer. Alternatively, a new different polishing pad having a smaller thickness variation than the polishing pad that has been used in the first polishing step S11 to perform additional polishing of the failed wafer. Further alternatively, a new polishing pad may be used not for the failed wafer, but when the first polishing step S11 in the next batch is performed. In this case, the 2 mm square nanotopography (50% threshold value) can be reduced to 1.0 nm or less in the next batch although the nanotopography of the failed wafer is not improved. When the nanotopography value is 0.1 nm or less, ROA≤20 nm can also be achieved while using a polishing pad that has been improved in thickness distribution.

When the in-plane thickness variation (standard deviation) of the polishing pad used in the first polishing step S11 is set to 2.0 μm or less, the 50% threshold value for the nanotopography within a 2 mm square site can be reduced to 1.0 nm or less; however, suppressing effect for, e.g., a 99.5% threshold value is small. The nanotopography extracted based on a 99.5% threshold level includes a previous process-derived large waviness that cannot be corrected by CMP, so that no change occurs even when CMP conditions are changed. However, a waviness of the 50% threshold level can be controlled by CMP, allowing improvement in the nanotopography. The 50% threshold value is the median value of the nanotopography distribution around which many sites are distributed, allowing the nanotopography within many sites to be improved.

In general, a change in the nanotopography (threshold curve) when the threshold value is changed from 0% to 100% significantly differs according to the nanotopography site size. That is, nanotopography within a 2 mm square site draws a threshold curve completely different from the nanotopography within, e.g., a 10 mm square. For example, although there can be a case where the 99.5% threshold value for the nanotopography within a 10 mm square is smaller than a 1% threshold value for the nanotopography within a 2 mm square, a probability that the 99.5% threshold value for the nanotopography within a 10 mm square is smaller than a 10% threshold value for the nanotopography within a 2 mm square is very low, and a probability that the 99.5% threshold value for the nanotopography within a 10 mm square is smaller than the 50% threshold value for the nanotopography within a 2 mm square is nearly zero.

Further, even for the same 2 mm square nanotopography, the 50% threshold value is sufficiently smaller than the 99.5% threshold value and is typically 0.4 times or less. That is, when the 50% threshold value for the nanotopography within a 2 mm square is 1.0 nm, the 99.5% threshold value for the nanotopography within a 2 mm square is 2.5 nm or more.

As described above, in the silicon wafer polishing method according to the present embodiment, the in-plane thickness variation (standard deviation) of the polishing pad used in the first polishing step S11 with a machining allowance of 0.3 μm or more is set to 2.0 μm or less, so that the nanotopography within a 2 mm square site on the wafer surface caused due to the thickness variation (standard deviation) of the polishing pad can be improved. In particular, the 50% threshold value for the nanotopography within a 2 mm square site can be reduced to 1.0 nm or less. This makes it possible to reduce a variation in device characteristics in the wafer plane and thereby to manufacture semiconductor chips having uniform device characteristics.

While the preferred embodiment of the present invention has been described, the present invention is not limited to the above embodiment, and various modifications may be made within the scope of the present invention, and all such modifications are included in the present invention.

For example, the wafer polishing method according to the above embodiment includes a polishing step in two stages of different polishing rates; however, the number of stages is not limited to two, but the polishing step may have three or more stages. Further, although the polishing method is applied to a silicon wafer in the above embodiment, the present invention can be applied to wafers other than silicon.

Further, in the above embodiment, the 2 mm square site is set on the wafer, and nanotopography within each site is evaluated; however, in the present invention, the site size is not limited to the 2 mm square, but the site may have a size of, e.g., 2 mm×1 mm or may be a circular area of ϕ2 mm. That is, the site only needs to have a size with a length in at least one direction of 2 mm and an area of 2 $mm^2$ or more and 4 $mm^2$ or less.

EXAMPLES

There was evaluated influence that the thickness variation (standard deviation) of the polishing pad had on the nanotopography. First, polishing pad samples #1 to #5 were prepared. The samples #1 to #3 were each a polishing pad having an underlying layer of nonwoven fabric bound by polyurethane and an NAP layer formed thereon, and the surface of the nonwoven fabric was smoothened so as to reduce the thickness variation. The thicknesses of the samples #1 to #3 were made different such that #1>#2>#3. The samples #4 and #5 were each a polishing pad formed only from an NAP layer. The sample #4 had a two-layer NAP structure obtained by laminating two NAP layers, and the sample #5 was a single-layer NAP structure using only one NAP layer.

Then, the thickness distribution was measured for the polishing pad samples #1 to #5. The measurement of the thickness of the polishing pad was made using a Schopper thickness gauge such that the thickness within 80 cm×80 cm square area was measured at 2 cm intervals, followed by mapping of the measurement results. The measurement of the thickness of the polishing pad was made using a Schopper thickness gauge. The evaluation results of the thickness distributions of the polishing pads #1 to #5 are shown in Table 1.

TABLE 1

| Sample | Type | Ave(mm) | R (mm) | σ (mm) |
|---|---|---|---|---|
| #1 | Nonwoven fabric + NAP | 0.724 | 0.156 | 0.0254 |
| #2 | Nonwoven fabric + NAP | 0.650 | 0.049 | 0.0160 |
| #3 | Nonwoven fabric + NAP | 0.684 | 0.040 | 0.0059 |
| #4 | Two NAP layers | 0.616 | 0.017 | 0.0016 |
| #5 | Single NAP layer | 0.304 | 0.008 | 0.0011 |

As shown in Table 1, average values Ave (mm) of the thickness distributions of the polishing pad samples #1 to #5 were such that #1>#3>#2>#4>#5. On the other hand, ranges R (mm) and standard deviations σ (mm) of the thickness distributions of the polishing pad samples #1 to #5 were such that #1>#2>#3>#4>#5.

Then, the polishing pad samples #1 to #5 were used to perform single-sided polishing for silicon wafers W1 to W5 each having a diameter of 200 mm. Thereafter, the 2 mm square nanotopography of the silicon wafers W1 to W5 was measured. The measurement of the nanotopography was made using an optical interferometric flatness/nanotopography measuring device (KLA-Tencor Corporation: Wafer Sight 2). The site size of each wafer was set to 2 mm square, and the nanotopography value within each site was calculated and mapped. Further, the 99.5% threshold value and 50% threshold value were calculated from the nanotopography distribution. The results are shown in Table 2.

The 99.5% threshold value of nanotopography refers to a nanotopography value whose cumulative probability is 99.5%. Further, as described above, the 50% threshold value for the nanotopography refers to a nanotopography value whose cumulative probability is 50%. That is, the 99.5% threshold value of nanotopography is a maximum value of nanotopography after the top 0.5% values, which are very large abnormal values, are excluded, and the 50% threshold value for the nanotopography refers to a maximum value when only relatively small nanotopography is set as an evaluation target with the exclusion of the top 50% nanotopography.

TABLE 2

| Thickness variation of polishing pad [μm] | 99.5% threshold value for nanotopography [nm] | 50% threshold value for nanotopography [nm] |
|---|---|---|
| 25 | 3.9 | 2.8 |
| 16 | 3.8 | 1.9 |
| 5.9 | 3.6 | 1.3 |
| 1.6 | 3.5 | 0.9 |
| 1.1 | 3.6 | 0.7 |

Figure 4:
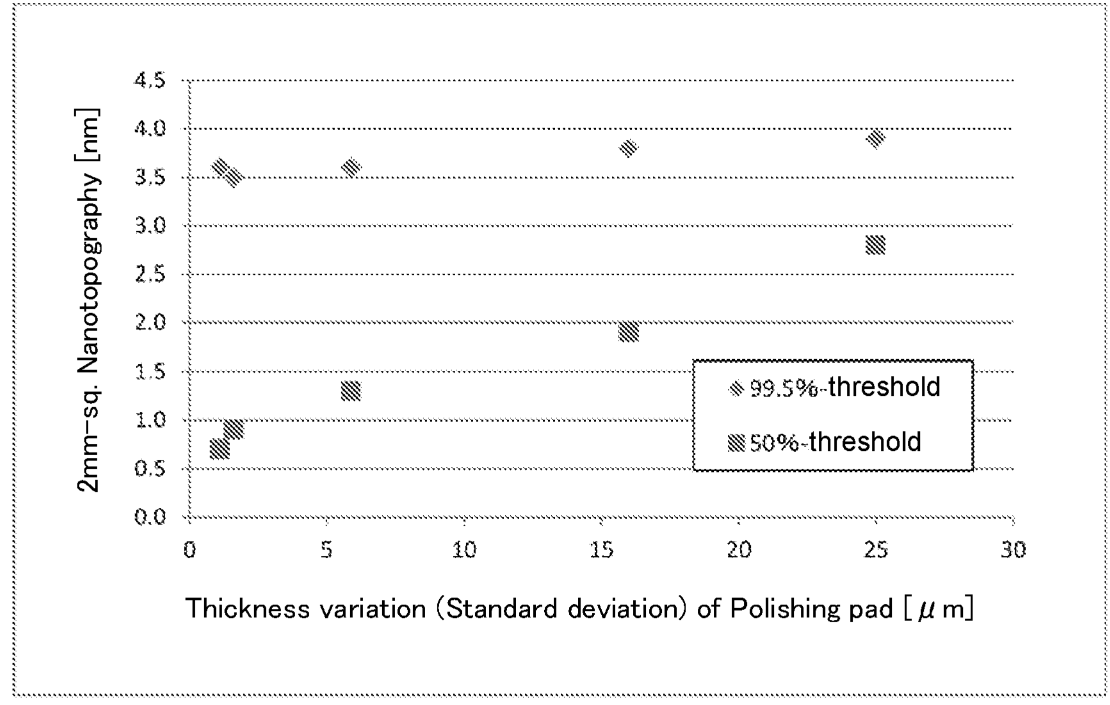
FIG. 4 is a graph showing the relation between the thickness variation distribution (standard deviation) of the polishing pad and the 2 mm square nanotopography value.

FIG. 4 is a graph showing the relation between the thickness variation distribution (standard deviation) of the polishing pad shown in Table 2 and the 2 mm square nanotopography value.

As illustrated in FIG. 4, the 99.5% threshold value for the nanotopography has a small correlation with the thickness variation (standard deviation) of the polishing pad, and the thickness variation (standard deviation) of the polishing pad has little influence on the 99.5% threshold value. On the other hand, the 50% threshold value has a large correlation with the thickness variation (standard deviation) of the polishing pad, and the larger the thickness variation (standard deviation) of the polishing pad is, the larger the 50% threshold value of nanotopography is. Thus, the 2 mm square site nanotopography can be reduced by reducing the thickness variation (standard deviation) of the polishing pad. Further, it can be seen from the graph of FIG. 4 that in order to reduce the 50% threshold value for the 2 mm square site nanotopography to 1.0 nm or less, it is necessary to reduce the thickness variation (standard deviation) of the polishing pad to 2.0 μm or less.

Then, there was evaluated influence that the relative speed of the wafer to the polishing pad had on the nanotopography.

Figure 5:
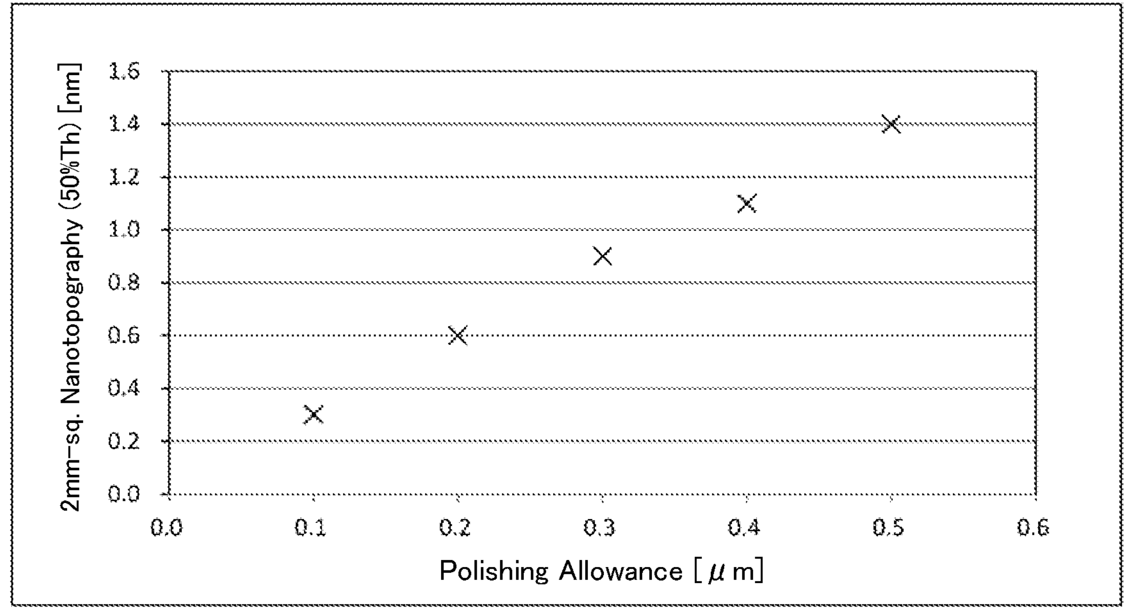
FIG. 5 is a graph showing the relation between the polishing allowance of the wafer and the nanotopography within the 2 mm square site.

First, the nanotopography (50% threshold value (50% Th)) within the 2 mm square site of the wafer when the polishing allowance of a silicon wafer having a diameter of 300 mm and a thickness of 780 μm was sequentially increased by 0.1 μm from 0.1 μm to 0.5 μm was measured. The thickness variation (standard deviation) of the polishing pad used in the polishing of the silicon wafer was 1.6 μm. As a result, it can be seen that, as illustrated in FIG. 5, the larger the polishing allowance of the wafer is, the more the 2 mm square nanotopography characteristics deteriorate.

Then, there was evaluated the nanotopography (50% threshold value (50% Th)) within the 2 mm square site when the relative speed of the wafer was changed from 0.2 m/s to 1.1 m/s. The results are shown in FIG. 6.

Figure 6:
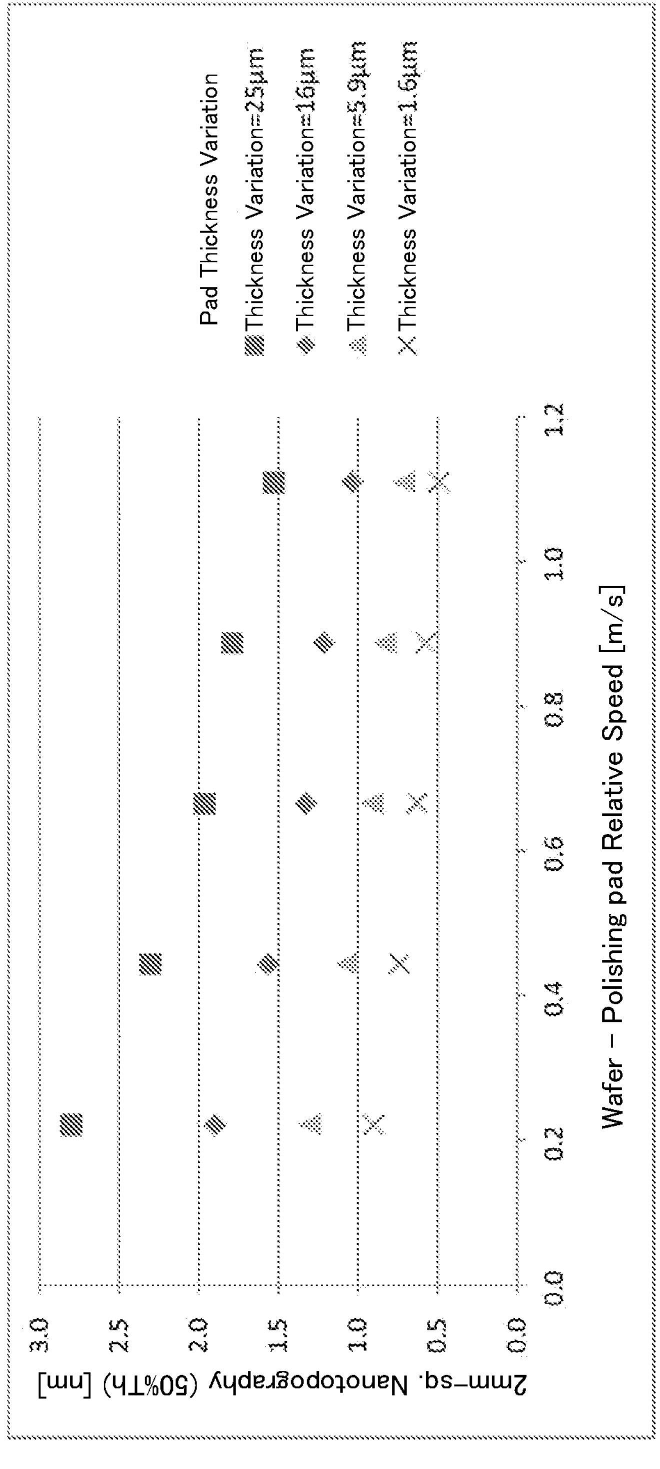
FIG. 6 is a graph showing the relation between the relative speed of the wafer to the pad and the nanotopography in the site of 2 mm square.

It can be seen from FIG. 6 that the higher the wafer polishing speed is, the smaller the nanotopography is and, conversely, the lower the wafer polishing speed is, the larger the nanotopography is. It can further be seen that the larger the thickness variation (standard deviation) of the polishing pad is, the larger the nanotopography is.

Then, there was evaluated the ROA at the wafer outer peripheral portion when the relative speed of the wafer was changed from 0.2 m/s to 1.1 m/s. The ROA is a flatness index at the wafer outer peripheral portion and is defined as a roll-off amount at a position 149 mm (1 mm inward from the wafer outermost periphery) from the wafer center when the least square plane of a rectangular area obtained by peripherally dividing the section 120 mm to 148 mm from the wafer center at 5° intervals is set as a reference plane. The results are shown in FIG. 7.

Figure 7:
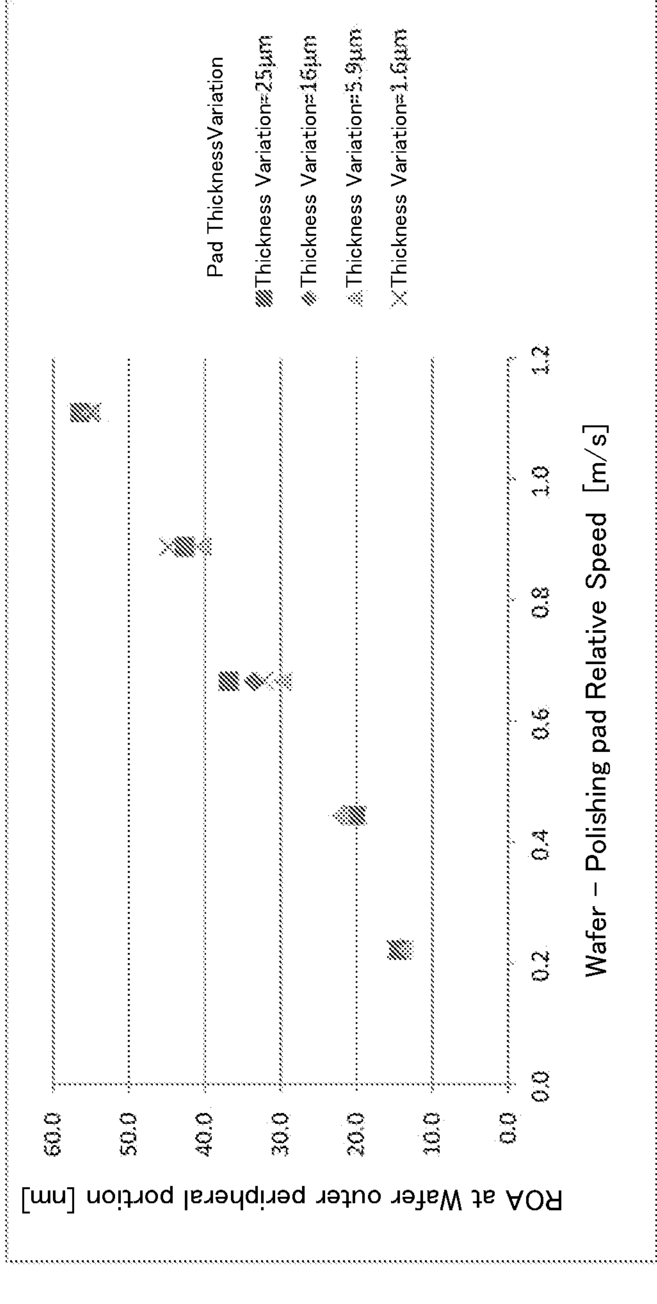
FIG. 7 is a graph showing the relation between the relative speed of the wafer to the pad and the ROA at the wafer outer peripheral portion.

It can be seen from FIG. 7 that the higher the wafer polishing speed is, the more the ROA at the wafer outer peripheral portion deteriorates. It can further be seen that the thickness variation (standard deviation) of the polishing pad does not have influence on the ROA at the wafer outer peripheral portion.

The above results reveal that in order to reduce the 2 mm square nanotopography to 1.0 nm or less, it is necessary to set the thickness variation (standard deviation) of the polishing pad to 1.6 μm or less and that when the thickness variation (standard deviation) of the polishing pad is 1.6 μm, it is necessary to set the relative speed of the wafer to 0.5 m/s or more. The results further reveal that when the thickness variation (standard deviation) of the polishing pad is 1.6 μm or less, the 2 mm square nanotopography can be reduced to 1.0 nm or less in a wide range (0.2 m/s to 1.1 m/s) of the relative speed of the wafer. On the other hand, it can be seen that in order to reduce the ROA at the wafer outer peripheral portion to 20 nm or less, it is necessary to set the relative speed of the wafer to less than 0.4 m/s.

Thus, in order to reduce the 2 mm square nanotopography to 1.0 nm or less and to reduce the ROA at the wafer outer peripheral portion to 20 nm or less, it is preferable to set the thickness variation (standard deviation) of the polishing pad to 1.6 μm or less and to set the relative speed of the wafer to 0.3 m/s or less.

DESCRIPTION OF REFERENCE NUMERALS

10 Silicon wafer
100 Single-sided polishing apparatus
120 Polishing head
124 Retainer ring
124A Lower end surface of the retainer ring
140 Rotary platen
150 Polishing pad
160 Slurry supply means
170 Slurry

What is claimed is:

1. A method of chemical mechanical polishing on a surface of a wafer through two or more polishing processes with different polishing rates, the method comprising:

a first polishing process of polishing the surface of the wafer by 0.3 μm or more at a first polishing rate;

a second polishing process of polishing the surface of the wafer at a second polishing rate lower than the first polishing rate, wherein a polishing pad used in the first polishing process comprises an 80 cm by 80 cm square area having an in-plane thickness variation (standard deviation) of 2.0 μm or less, where the in-plane thickness variation is determined by measuring the thickness of the polishing pad using a Schopper thickness gauge at 2 cm intervals throughout the entire 80 cm by 80 cm square area to obtain measurement results, mapping the measurement results, and calculating the standard deviation of the mapped measurement amounts; and the polishing pad has a two-layer structure in which a polyurethane foam NAP layer is formed on an underlying layer;

measuring the thickness of the polishing pad within an 80 cm by 80 cm square area at 2 cm intervals using a Schopper thickness gauge; and wherein a 50% threshold value for nanotopography within a site that is defined on the surface of the wafer that has been polished through the first and second polishing processes, the site having a size of a square that is 2 mm by 2 mm, is 1.0 nm or less.

2. The wafer polishing method as claimed in claim 1, wherein the first polishing rate is 50 nm/min or more.

3. The wafer polishing method as claimed in claim 1, wherein a relative speed of the wafer to the polishing pad in the first polishing process is 0.3 m/s or less, and the in-plane thickness variation (standard deviation) of the polishing pad used in the first polishing process is 1.6 μm or less.

4. The wafer polishing method as claimed in claim 3, wherein a ROA at a position 1 mm inward from an outermost periphery of the wafer that has been polished through the first and second polishing processes is 20 nm or less.

5. The wafer polishing method as claimed in claim 1, further comprising:

a polishing pad thickness evaluation process of measuring an in-plane thickness variation of a polishing pad used in chemical and mechanical polishing of a wafer and checking whether or not the in-plane thickness variation (standard deviation) is 2.0 μm or less; and a polishing pad thickness adjustment process of adjusting, when the in-plane thickness variation (standard deviation) of the polishing pad is not 2.0 μm or less, the thickness distribution of the polishing pad so as to reduce the thickness variation (standard deviation) to 2.0 μm or less, wherein the polishing pad having an in-plane thickness variation (standard deviation) of 2.0 μm or less is used to polish the surface of the wafer by 0.3 μm or more.

* * * * *